United States Patent [19]
Cesar

[11] Patent Number: 5,045,977
[45] Date of Patent: Sep. 3, 1991

[54] SHIELDING ASSEMBLY FOR A TERMINAL STRIP CONNECTED TO AN ELECTRICAL DEVICE LOCATED INSIDE A CHASSIS

[75] Inventor: Charles Cesar, Saint Martin D'Heres, France

[73] Assignee: Bull S.A., Paris, France

[21] Appl. No.: 584,452

[22] Filed: Sep. 18, 1990

[30] Foreign Application Priority Data

Sep. 19, 1989 [FR] France .................. 89 12288

[51] Int. Cl.[5] .......................................... H05K 9/00
[52] U.S. Cl. .................................. 361/424; 361/391; 361/426; 439/607
[58] Field of Search ............... 248/27.1; 174/35 R, 174/35 C, 52.1; 361/334, 346, 380, 390, 391, 393–395, 399, 412, 413, 415, 424, 426, 428; 439/76, 544, 545, 607–610, 855

[56] References Cited

U.S. PATENT DOCUMENTS

| | | | |
|---|---|---|---|
| 3,476,983 | 11/1969 | Robertis | 317/101 |
| 4,550,960 | 11/1985 | Asick et al. | 339/14 R |
| 4,632,476 | 12/1986 | Schell | 339/14 R |
| 4,720,770 | 1/1988 | Jameson | 361/424 |
| 4,738,637 | 4/1988 | Asick et al. | 439/610 |
| 4,901,205 | 2/1990 | Landis | 361/424 |
| 4,922,382 | 5/1990 | Hobbins | 361/424 |
| 4,970,625 | 11/1990 | Belanger | 361/424 |

FOREIGN PATENT DOCUMENTS 8517334 6/1985 Fed. Rep. of Germany .

*Primary Examiner*—Gerald P. Tolin
*Attorney, Agent, or Firm*—Weingarten, Schurgin, Gagnebin & Hayes

[57] ABSTRACT

A shielding assembly, mounted on a terminal strip that is mounted inside a chassis on a circuit board, includes two walls that are connected by partitions arranged to form a plurality of receiving recesses for receiving a plurality of shielded connectors. The shielding assembly passes through an opening in a housing panel of the chassis and is electrically connected to the housing panel, thus providing a direct connection between the housing panel and the shielding of the connectors inserted into the receiving recesses.

9 Claims, 5 Drawing Sheets

5,045,977

SHIELDING ASSEMBLY FOR A TERMINAL STRIP CONNECTED TO AN ELECTRICAL DEVICE LOCATED INSIDE A CHASSIS

FIELD OF THE INVENTION

This invention relates to a shielding assembly for a terminal strip connected to an electrical device located inside a chassis, and in particular to a shielding assembly for connecting electronic devices used for data processing.

BACKGROUND OF THE INVENTION

In designing electronic equipment to be used for telecommunications and for data processing, extensive use is made of electrical devices of a more or less complex nature. Such devices, like electrical measuring recorders or electronic circuits that operate on pulses, for example, are especially sensitive to the disturbing effects of electromagnetic radiation generated by other electrical circuits not part of these devices. Consequently, these electrical devices are usually protected against these parasitic radiations by enclosing them inside a metal chassis that serves both to provide mechanical support and to shield the electrical device. Each of these electrical devices usually includes a central control device that usually includes one or more printed circuit boards populated with electronic components, and housed in a fixed metal box integral with the metal chassis; and of one or more peripheral devices which, like recording devices or disk readers, for example, are mounted in removable metal boxes that can be installed inside the chassis. In this arrangement, each peripheral device is connected to the central control device by a shielded multiconductor cable attached at one end to the intrinsic electrical circuits of this device, and at the other end to a shielded connector for connecting this cable to the electrical circuits of the central control device. To this end, the central control device is equipped with a terminal strip of the type described in French Patent 2,566,193 (corresponding to a British Patent Application published under number 2,160,719), this terminal strip being mounted on a circuit board and comprising an elongated insulating body with a coupling face perpendicular to the board, and designed to receive a plurality of shielded connectors. This terminal strip is provided with, disposed on its upper surface and the two lateral surfaces adjacent to its coupling face, a metal hood extending beyond the limits of the contact elements projecting from this coupling face, and serving as shielding for these elements. To this end, this hood is provided with metal feet passing through the circuit board and soldered to conducting areas provided on one of the faces of this board, the conducting areas themselves being electrically grounded. When the device including this circuit board and this terminal strip is installed inside a shielded chassis, it is grounded by simply connecting these conducting areas to metal parts located inside the chassis supporting this device. This shielded chassis is provided with an opening opposite the terminal strip, the opening having dimensions larger than those of the terminal strip and designed to allow shielded connectors to be inserted inside the chassis, without being impeded by the operator, for connection to the terminal strip. In addition, the metal hood covering the terminal strip is also provided with elastic conducting fingers; when a shielded connector is connected to the terminal strip, these fingers come in contact with the shielding element of this connector. This being the case, this shielding element, like the shielding in the cable sheath which is integral with this connector, is grounded successively through these elastic fingers, the metal hood, the conducting areas of the circuit board, the metal parts holding this board to the chassis, and finally connectors that normally ground this chassis. This procedure requires that the circuit board comprise, in addition to the usual conductors employed to transmit electrical signals or to apply electrical potentials of given values, specific metallic areas allowing the shielding hood to be permanently mounted on this board, and also to be connected electrically to the chassis. However, the presence of these metal areas has the disadvantage that they take up a relatively large amount of the surface of the board, resulting either in a significant increase in the dimensions of the board or in a sharp increase in the density of the other conductors mounted thereon. In addition, these metallic areas, located near these other conductors, pose the risk of coming accidentally in contact with them, causing short circuits. In addition, in cases when the terminal strip is designed to receive a significant number of connectors, more than six for example, the shielding hood will not provide sufficient protection for the contact elements of this terminal strip, especially if, in certain specific applications, a plurality of connectors, normally connected side by side to this terminal strip, must be withdrawn from it. Finally, the conducting portion of the circuit that includes the shielding element of each connector, the elastic fingers, the metal hood, the conducting areas, and the metal parts attaching the board to the chassis, is located practically entirely inside the chassis. As a result, any parasitic electrical currents created in the shielding of each cable under the influence of electromagnetic radiation outside the chassis will, on passing through this conducting part of the circuit and flowing naturally to ground, generate electromagnetic radiation whose magnitude increases with the area of the loop that includes this conducting portion. The electromagnetic radiation produced by this conducting portion inside the chassis thus poses the risk of interfering with the electrical circuits this chassis is designed to protect.

SUMMARY OF THE INVENTION

A shielding assembly for use with a terminal strip is disclosed for providing an electrical connection between a plurality of shielded connectors and an electrical device located inside a chassis. The terminal strip includes an elongated insulating body having a coupling face designed to receive a plurality of complementary shielded connectors, the insulating body being provided with contact elements that are connected to the circuits of the electrical device and are designed to be connected to a contact element of each of the complementary connectors. The shielding assembly includes two metal walls each respectively covering one of the two faces of the elongated insulating body with the largest dimensions, adjacent to this coupling face, the faces extending from the interior to the exterior of this chassis, so that their outside edges, parallel to this housing panel, extend beyond the ends of the contact elements of this insulating body; and a plurality of metal partitions between these two walls, perpendicular thereto and to the coupling face, the partitions each extending from the face as far as the outside edges of the walls, to form with these walls a plurality of recesses for receiving complementary shielded connectors, each recess being dimensioned such that the walls and partitions delimiting it come in contact with the complementary connector shielding inserted into this recess, the shielding assembly being connected electrically to the shielding panel by a conducting element that does not enter the chassis, wherein the insulating body is so positioned inside the chassis that its contact elements pass through an opening in one of the metal shielding panels of this chassis.

The shielding assembly of the invention makes it possible, without recourse to a circuit board provided with specific metallic areas, to protect the contact elements of this terminal strip effectively against external electromagnetic radiation, and to do this even when the number of connectors connected to the terminal strip is relatively small.

DESCRIPTION OF THE DRAWING

The invention will be more fully understood from the following detailed description, in conjunction with the accompanying figures, in which.

DETAILED DESCRIPTION OF THE INVENTION

Figure 1:
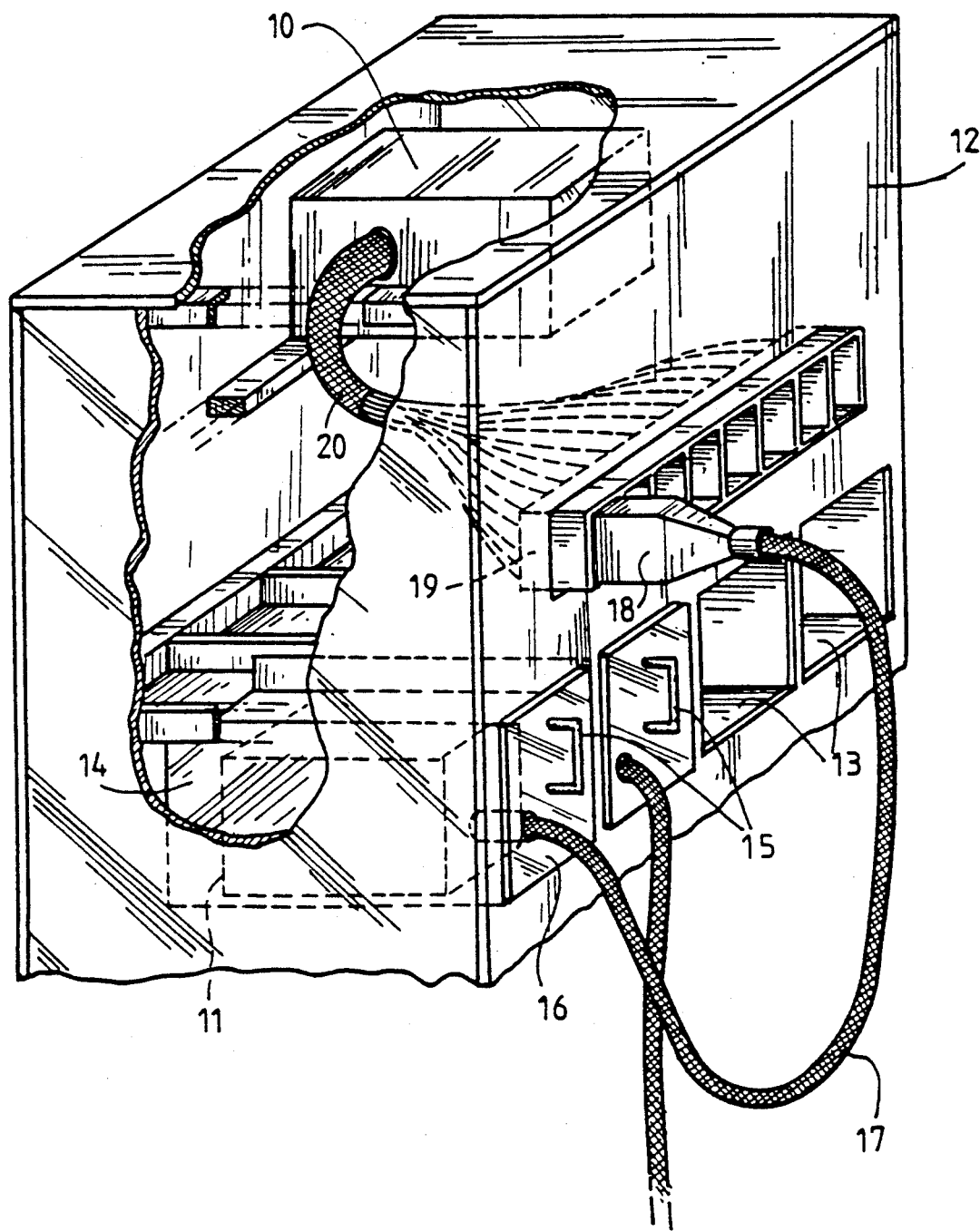
FIG. 1 is a schematic diagram in perspective, showing a supporting chassis provided with a terminal strip having a shielding assembly according to the invention and designed to receive removable boxes containing electrical devices designed to be connected by means of this terminal strip to a central control device inside this supporting chassis.

A supporting chassis, partly shown in FIG. 1, provides both mechanical support and electromagnetic shielding for an electrical device that includes both an electrical control device 10 and a plurality of peripheral electrical devices, of which only one 11 is shown schematically in dot-dashed lines. The peripheral devices are controlled by the control device 10 and therefore is connected thereto in a manner to be indicated below. The supporting chassis, parallelepipedic in shape, includes metal panels assembled in known fashion using corners and braces, the housing panels delimiting the internal space of this chassis. One of the four vertical enclosure panels 12 of this supporting chassis is provided with openings 13 giving access to compartments in which drawers 14 can be engaged, each containing one of the peripheral devices 11. To this end, each drawer is provided with a handle 15 which, mounted on the front wall 16 of the drawer, allows the operator to grasp it, either to install the drawer in one of the compartments of the supporting chassis or to pull it out of the compartment. Each device 11 in each drawer is connected to the control device 10 by a shielded multiconductor cable 17 that is connected at each end to electrical circuits of the device and passes through a hole in the front wall of the drawer. The cable 17 is provided at its other end with a shielded connector 18 that is connectable to a terminal strip 19 located opposite an opening in the enclosure panel 12 of the supporting chassis, terminal strip 19 itself being connected to control device 10. In the embodiment shown in FIG. 1, the link between the terminal strip 19 and the control device 10 is provided by a multiconductor cable 20, but it is understood that, as will be seen later on, this connection could be established through a circuit board. Similarly, although control device 10 has been shown symbolically in the form of a parallelepipedic block in FIG. 1, it will be understood that in reality this equipment includes a set of printed circuit boards mounted in known fashion in slides or grooves provided inside one bay of the supporting chassis. For example, an assembly of this type has been described and shown in U.S. Pat. No. 3,476,983.

Figure 2A:
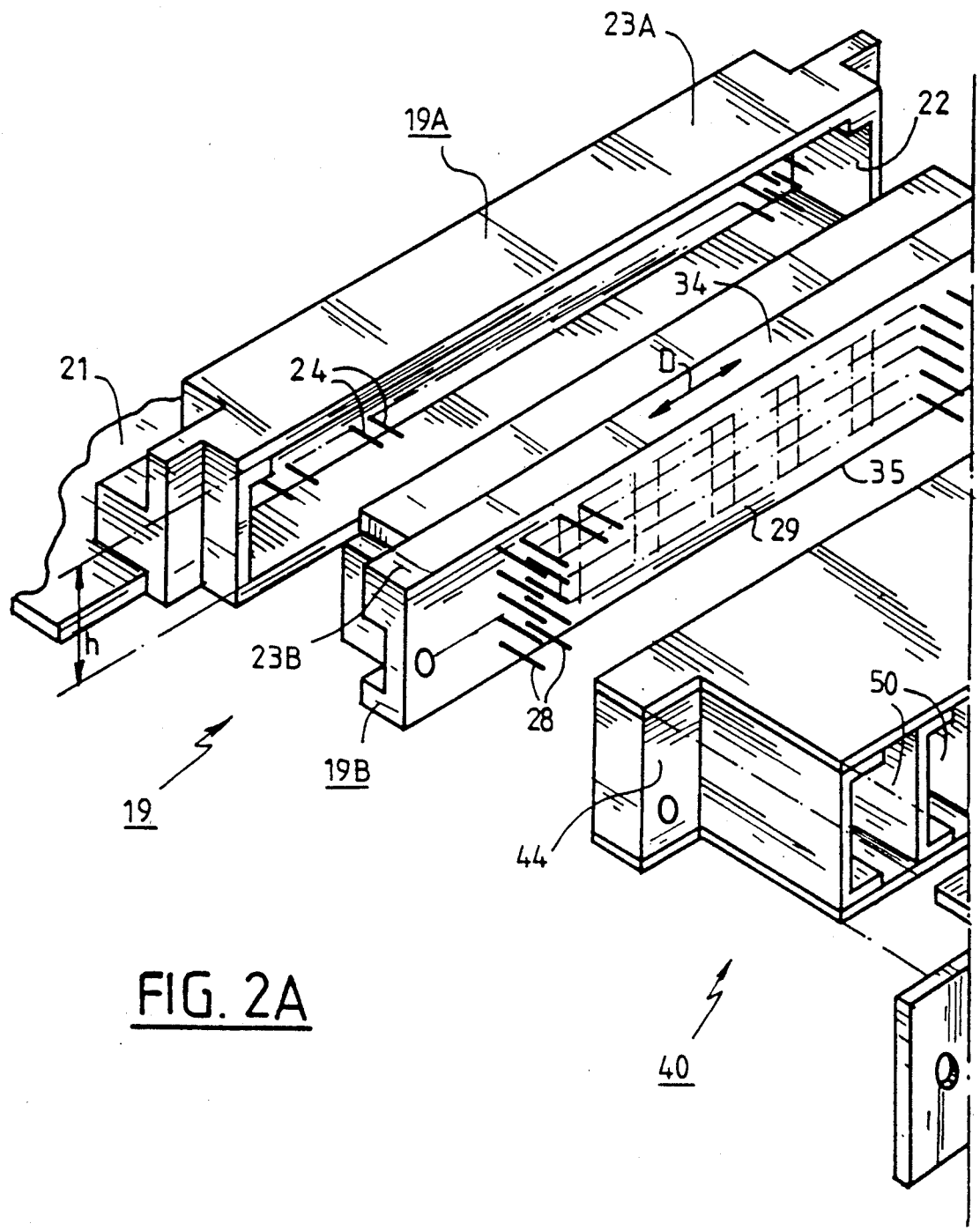
FIGS. 2A and 2B together present an exploded perspective view of the terminal strip and shielding assembly provided for the supporting chassis shown in FIG. 1.
Figure 2B:
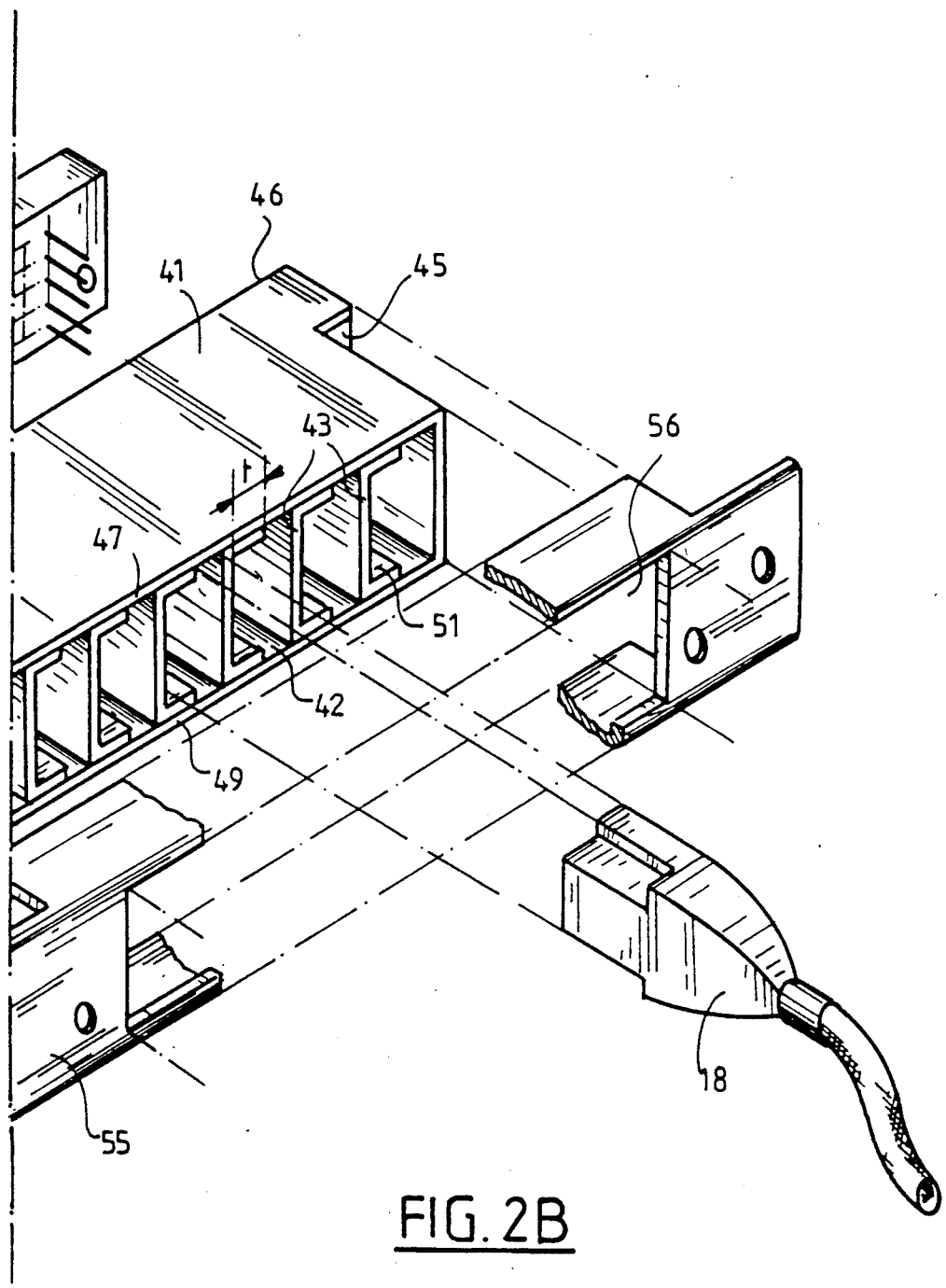
Figure 3:
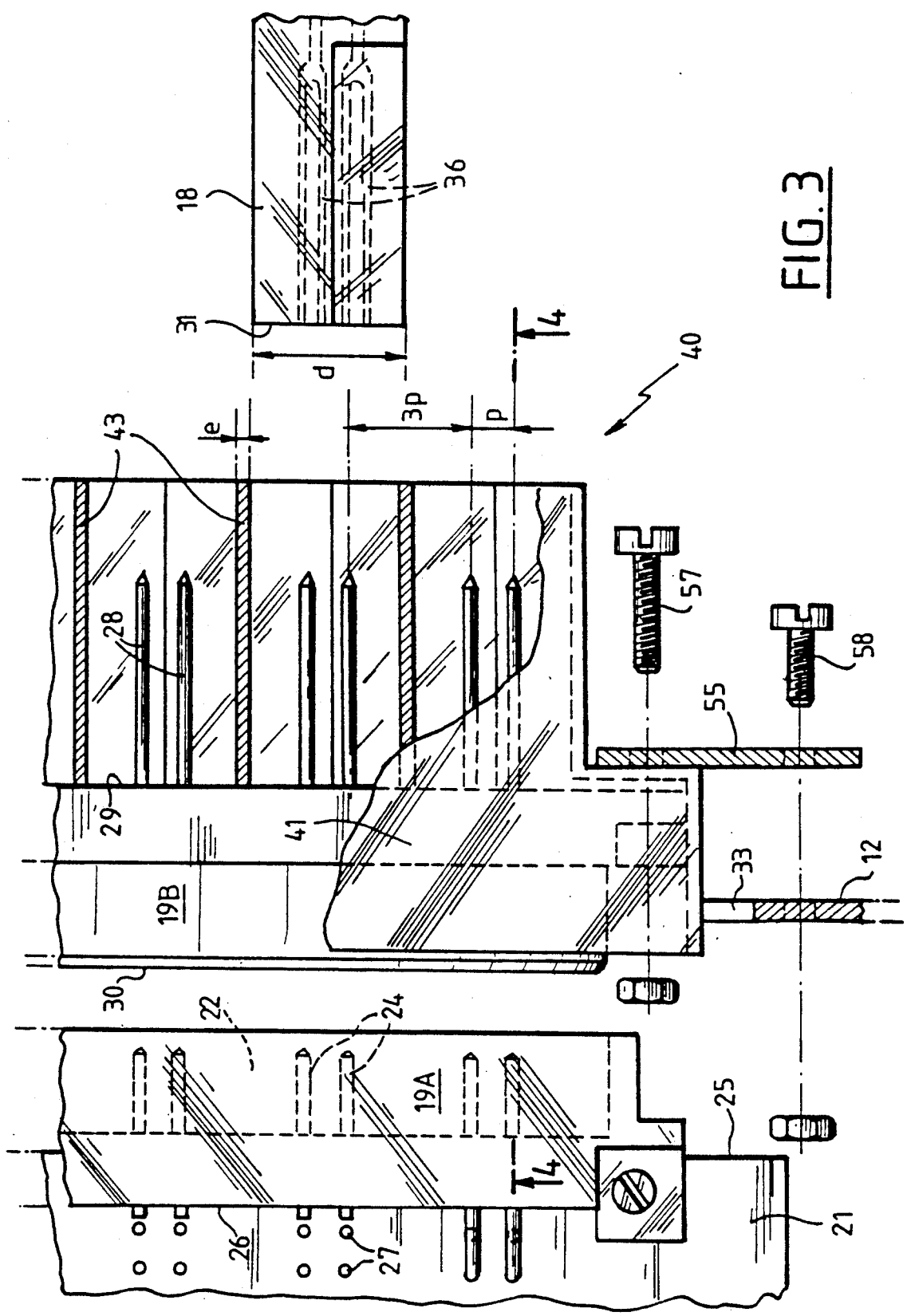
FIG. 3 is a plan view, partially cut away, showing how the various components of the terminal strip and shielding assembly are assembled and positioned when installed in the supporting chassis shown in FIG. 1.
Figure 4:
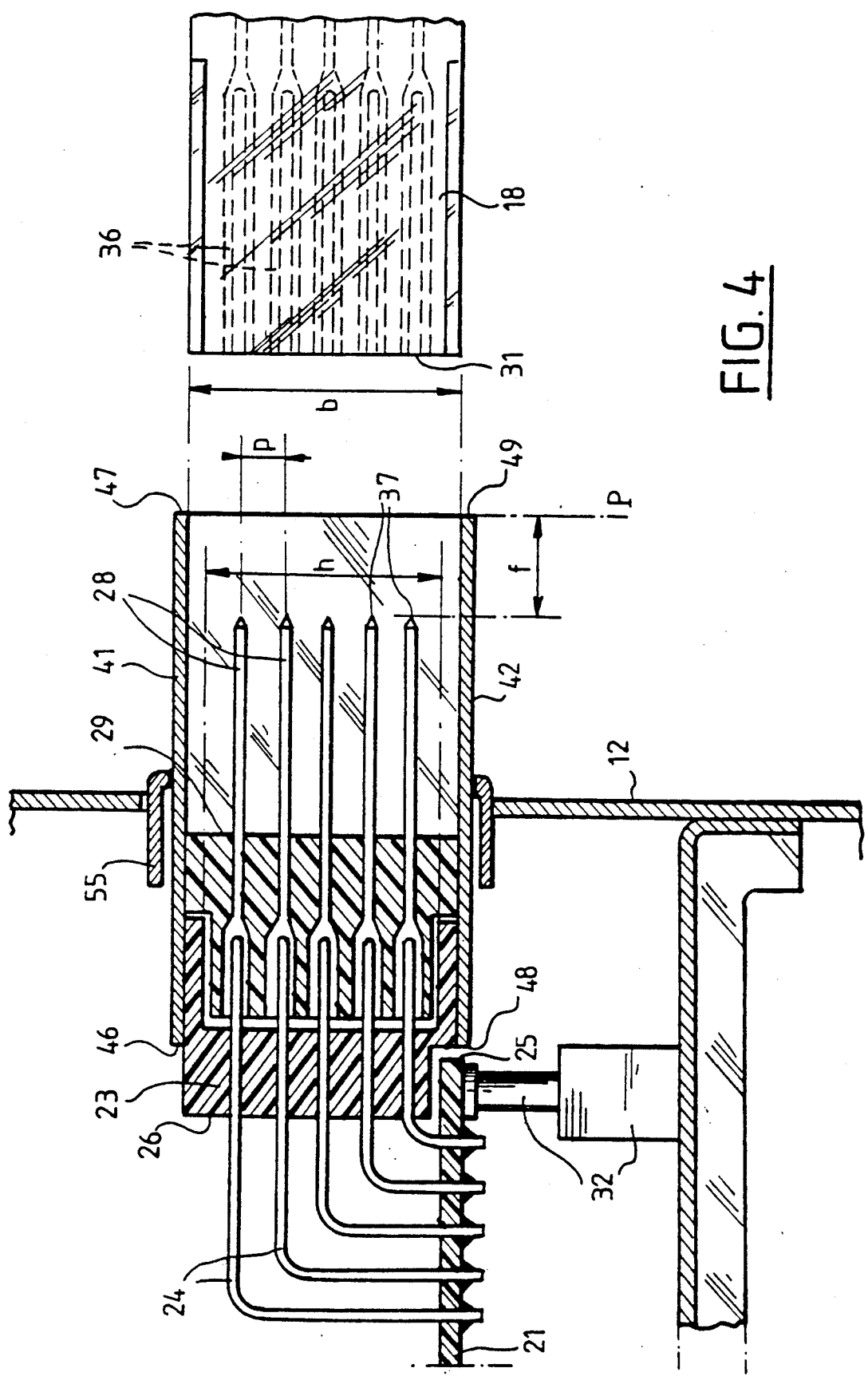
FIG. 4 is a cross-sectional view, taken along a plane on a line indicated by 4—4 in FIG. 3, showing the positions of the contact elements of the terminal strip relative to the shielding assemblies when all the components of this terminal strip and shielding assembly have been installed in the supporting chassis of FIG. 1.

With reference to FIGS. 2A, 2B, 3, and 4 we shall describe the structure of the terminal strip 19 shown schematically in FIG. 1. The terminal strip in FIGS. 2A and 2B includes two parts, a main part 19A integral with a circuit board 21 for providing an electrical connection between the terminal strip and control device 10, and a complementary part 19B to be housed in a recess 22 in the main part 19A. The main part 19A includes an elongated body 23A made of insulating material and a plurality of contact pins 24 traversing insulating body 23A and projecting at one end into the interior of recess 22 in the body. FIGS. 3 and 4 show that insulating body 23A is mounted along one edge 25 of circuit board 21 s that the walls of the body delimiting recess 22 overhang edge 25. FIGS. 3 and 4 also illustrate that the portions of contact pins 24 projecting beyond face 26 of the body opposite recess 22 are bent at right angles to allow these portions, when mounting the main part 19A on the board 21, to be engaged in holes 27 in this board and soldered to the conductors on the board. The complementary part 19B of the terminal strip includes, as may be seen in FIGS. 2A, 3 and 4, an elongated body 23B made of an insulating material and a plurality of contact elements 28 oriented in a direction perpendicular to the long direction D of the body 23B and traversing the body so that they project at a coupling face 29 of the body and terminate on a face 30 of the body parallel to and opposite the coupling face 29. Each of the contact elements is provided at the end opposite face 30 with a recessed part into which the portion of a contact pin 24, that projects into this recess, fits when matching part 19A is inserted into recess 22.

It should be noted that the coupling face 29 is designed to receive shielded connectors resembling those indicated by reference number 18 in FIG. 1. Without going into detail, we shall consider that each of these connectors in the example described has ten contact elements 36, as shown in FIGS. 3 and 4, that are designed to be connected individually to contact elements 28 of body 23B. It will also be understood that these ten contact elements, of the female type in this case, are arranged in two columns, each column including five contact elements, the contact elements being divided in each column with a spacing p equal to the distance p between the two columns. Consequently, as may be seen in FIGS. 2A, 3, and 4, contact elements 28 of body 23B, of the male type, are arranged on the coupling face 29 of the body in groups of 10 contact elements, the contact elements 28 of each group being arranged in two columns separated from one another by a distance p, as shown in FIG. 3, each of the columns including five contact elements distributed with a spacing p, as shown in FIG. 4. In addition, the groups of contact elements, as shown in FIG. 3, are separated from one another by a distance 3p. This manufacturing technique makes it possible to make parts 19A and 19B of the terminal strip from standard commercial connectors whose contact element recesses are arranged on the coupling faces of the connectors in five rows and n columns, the recesses being spaced regularly apart by the same distance p, in both the rows and the columns, with the contact elements fitting into only part of these recesses, thus forming an arrangement of contact elements whose locations are as indicated above.

As may be seen from FIGS. 2A, 2B, 3, and 4, each shielded connector 18 has a practically rectangular coupling face 31 with dimensions b and d, the face being oriented, when it is to be coupled to part 19B of the terminal strip, so that length b of this coupling face is perpendicular to the plane of circuit board 21. It is also evident from looking at FIGS. 2A and 4 that recess 22 in part 19A of this terminal strip has, in the direction perpendicular to the plane of board 21, a dimension h less than length b of coupling face 31 of shielded connector 18. It is therefore evident that, in the absence of part 19B, it would be physically impossible to connect each of the shielded connectors directly to part 19A. On the contrary, because coupling face 29 of complementary part 19B is not inside a recess with small dimensions, part 19B can easily be coupled to these shielded connectors, thus ensuring electrical connection of these connectors to the circuits of board 21.

It should also be pointed out that while the example described shows terminal strip 19 including two parts 19A and 19B each made of commercially available components which can nest into one another, this terminal strip could also be fabricated as one piece that includes a single insulating body with a coupling face for receiving the shielded connectors mentioned above, the insulating body being provided with contact elements adapted to be connected, at one end, to the circuits of circuit board 21, and to be connected, at the other end, with the complementary contact elements with which the shielded connectors are provided.

With reference to FIGS. 3 and 4, note that the circuit board 21, inside the supporting chassis, is made integral with the chassis by mounting elements 32 of known construction, and that it is located in a horizontal position so that when the two parts 19A and 19B of terminal strip 19 are joined to one another, contact elements 28 of this terminal strip pass through an opening 33 in vertical housing panel 12, thus projecting outside the chassis. To protect these contact elements effectively against the disturbing effects caused by electromagnetic radiation generated by devices located outside the support chassis, terminal strip 19 is provided with a shielding assembly 40, as shown in FIGS. 2A and 2B, and includes primarily two metal walls 41 and 42, parallel to one another and joined to one another by a plurality of metal partitions 43, the partitions being mounted in a row between these two walls and perpendicular thereto. Moreover, two mounting parts 44 and 45 are provided on walls 41 and 42 near the end partitions, to allow the shielding assembly to be mounted on part 19B of the terminal strip. The two metal walls 41 and 42 are so made that when this shielding assembly is mounted on part 19B, each covers one of the two faces with the largest dimensions, 34 and 35, adjacent to coupling face 29 on insulating body 23B. FIG. 4 shows the position of each of these two walls relative to the housing panel 12 when, after the shielding assembly has been mounted on part 19B of the terminal strip, part 19B is nested in part 19A of the terminal strip. It is evident from this figure that with a shielding assembly thus positioned, metal wall 41 has two edges 46 and 47 parallel to housing panel 12, one of which edges, 46, is inside the supporting chassis while the other, 47, is outside. Similarly, metal wall 42 has two edges 48 and 49 parallel to housing panel 12, with one edge 48 inside the chassis, and the other edge 49 outside. These two walls 41 and 42 are so dimensioned that, as may be seen in FIG. 4, their respective outer edges 47 and 49 project beyond ends 37 of contact elements 28 projecting from coupling face 29 of the terminal strip, with plane P passing through the two edges 47 and 49, separated from the ends by a distance f whose value will be defined below. In addition, it should be pointed out that as may be seen in this figure as well, both walls 41 and 42, at least their parts extending from coupling face 29 as far as their external edges 47 and 49, are separated from one another by a distance scarcely greater than length b of coupling face 31 of each of shielded connectors 18. It will be understood that under these circumstances, when a shielded connector 18 is engaged between walls 41 and 42 to be connected to terminal strip 19, the shielding surrounding the faces of this connector adjacent to this coupling face 31 rubs lightly against these two walls and thus comes in contact with the latter.

Referring now to FIGS. 2A, 2B, and 3, it will be evident that when shielding assembly 40 is mounted on part 19B of terminal strip 19, metal partitions 43 are disposed perpendicularly to coupling face 29 of the terminal strip, and that each of them extends, starting at this coupling face, as far as external edges 47 and 49 of walls 41 and 42. These metal partitions and these walls thus assembled then form receiving recesses 50 each adapted to receive a shielded connector 18. In the example described, these receiving recesses all have identical dimensions, with metal partitions 43 arranged to leave between them a space slightly greater than the width d of coupling face 31 of each of shielded connectors 18. This being the case, when a shielded connector is fitted into one of these recesses to be connected to terminal strip 19, the shielding surrounding this conductor rubs lightly against the two partitions delimiting this recess and thus comes in contact with these two partitions.

In the example described, contact elements 28 inside the same recess are arranged in two columns, with the two columns separated from one another by a distance p as shown in FIG. 3. However, it should be noted that this arrangement is not specific to the present invention and that in a more general embodiment, these contact elements could be arranged in m columns, spaced apart by a distance p, with contact elements 28 located inside a receiving recess being separated from those located in the adjacent recess by a distance kp, where k is a whole number, the shielded connectors of course being adapted, from the standpoint of their dimensions and the arrangement of their contact elements, to respond to the requirements of the selected embodiment. Finally, for reasons of economy, it may be necessary to use metal partitions 43 whose thickness e is relatively small, i.e. at least equal to the distance p separating two columns of contact elements, the distance p generally being less than 3 mm. It has thus been found that in order to meet this condition, coupling faces 31 of shielded connectors 18 must have a width d determined by the following double inequality:

$$(m+k-2)p < d < (m+k-1)p.$$

Consequently, if we use the letter j to represent the play required when a shielded connector slides inside a receiving recess, the thickness e of each of metal partitions 43 is given by the relationship:

$$e = (m+k-1)p - d - j.$$

Thus, in the example described, with the contact elements located in a receiving recess separated from those located in the adjacent recess by a distance of 3p (so that k=3) and where m=2 and p=2.54 mm, the shielded connectors must have a coupling face whose width d satisfies the double inequality:

$$(2+3-2)\,2.54 < d < (2+3-1)\,2.54$$

or: 7.62 mm < d < 10.16 mm.

In the case of the shielded connectors used in the example described, this width d is 9 mm and the play j believed necessary for these connectors to slide in the receiving recesses is assumed to be 0.16 mm. This being the case, the thickness e of metal partitions 43 is equal to;

$$e = (2+3-1)\,2.54 - 9 - 0.16$$

or: e = 1 mm.

It should also be pointed out, with reference to FIGS. 2A and 2B, that partitions 43 include parts whose cross-sections are essentially U-shaped, with portions 51 of these parts corresponding to the arms of the U serving to mount these parts on walls 41 and 42 by soldering. In addition, these portions with a width t less than the distance separating two consecutive partitions 43, introduce asymmetry into each receiving recess and consequently act as polarizing elements when shielded connectors are inserted into the receiving recesses. Of course the shielded connectors are shaped in known fashion, as shown in FIG. 2B, to adapt to the polarizing elements when they are inserted into the recesses.

It is also evident from inspection of FIG. 3 that shielding assembly 40, at least in the part surrounding the insulating body of terminal strip 19, has dimensions smaller than those of opening 33 in housing panel 12 of the supporting chassis. Consequently, this shielding assembly is provided with a metal plate 55 which, as shown in FIGS. 2A and 2B, is shaped so that it can adjust with very little play to walls 41 and 42 of this shielding assembly, the plate being pierced by a window 56 to permit receiving recesses 50 to pass through, and being dimensioned to come in contact, when parts 19A and 19B of the terminal strip are nested in one another, with those parts of housing panel 12 which are adjacent to opening 33, as may be seen by referring to FIG. 3. As can be seen from FIG. 3, this plate 55 is made integral with shielding assembly 40 by metal screws 57, the screws likewise ensuring that this shielding assembly remains attached to part 19B of the terminal strip. Other conducting screws 58 are used to hold plate 55 to housing panel 12. It is understood that, this being the case, when a shielded connector 18 is introduced into one of receiving recesses 50, the shielding of this connector makes electrical contact with housing panel 12, in other words with the supporting chassis, through shielding assembly 40, plate 55, and screws 57 and 58. Consequently, any parasitic electric currents created under the influence of electromagnetic radiation prevailing outside the supporting chassis in the cable shielding integral with this shielded connector go to ground, passing successively through the shielding of this connector, through shielding assembly 40, into plate 55, and into housing panel 12, thus forming a circuit outside the supporting chassis. Consequently, no electromagnetic radiation is generated inside the supporting chassis and the electrical circuits enclosed in the chassis are effectively protected.

It should be pointed out that to prevent contact elements 28 from being subjected excessively to the effects of external electromagnetic radiation, whenever these contact elements are not connected to contact elements 36 of the shielded connectors, ends 37 of contact elements 28 are recessed relative to external edges 47 and 49 of walls 41 and 42, the distance f separating the ends of plane P which passes through these two edges being equal to at least one third of the length b of coupling faces 31 of the shielded connectors. It should also be pointed out that in one especially advantageous embodiment, walls 41 and 42 as well as partitions 43 are composed of a corrosion-proof material which conducts electricity. Thus, in the example described, these walls and partitions are made of stainless steel.

Of course, the invention is not limited to the embodiments described and illustrated, and provided solely as an example. On the contrary, it includes all means constituting technical equivalents of those described and illustrated, considered separately or in combination, and implemented within the scope of the following claims.

I claim:

1. A shielding assembly and a terminal strip connected to an electrical device located inside a chassis, the terminal strip including an elongated insulating body 23A, 23B having a coupling face 29 designed to receive a plurality of complementary shielded connectors 18, the elongated insulating body being provided with contact elements of a first type 28, connected to the circuits of the electrical device and designed to be connected to contact elements of a second type 36 of each of said complementary shielded connectors, said shielding assembly being characterized by the insulating body being positioned inside the chassis so that its contact elements 28 pass through an opening 33 in one metal housing panel 12 of said chassis, said shielding assembly comprising:

two metal walls 41, 42, of a shield unit covering two faces 34, 35 in the insulating body, said metal walls adjacent to said coupling face 29, said metal walls extending from the interior to the exterior of said chassis through opening 33 so that their outer external edges 47, 49, are parallel to said housing panel 12, and extend beyond ends of the contact elements 28 of said insulating body; and a plurality of metal partitions 43 located between walls 41, 42 and perpendicular thereto and to said coupling face 29, said partitions each extending from said face 29 as far as said outer external edges 47, 49 of said walls, forming with these walls, a plurality of receiving recesses 50 for complementary shielded connectors, each recess being so dimensioned that the walls and partitions delimiting it come in contact with the shielding of the complementary connector inserted into this recess, said shielding assembly being connected electrically to housing panel 12 through a conducting element 55 that does not enter the interior of the chassis.

2. The shielding assembly of claim 1 wherein said conducting element includes a metal plate 55 shaped so that it can conform, with a very small amount of play, to said walls 41, 42 of said shielding assembly, said metal plate 55 being provided with a window 56 to allow passage of receiving recesses 50, and being dimensioned so as to be applicable to said housing panel 12, thereby forming an electrical connection between said housing panel and said shielding assembly.

3. The shielding assembly of claim 1, wherein each shielded connector 18 has a rectangular coupling face 31, and wherein said two walls 41, 42 of said shielding assembly are dimensioned such that plane P passes through said outer edges 47, 49 of these walls and is separated from the ends of contact elements 28 of insulating body 23A, 23B by a distance whose value f is at least equal to a third of the length b of said coupling face 31 of each shielded connector.

4. The shielding assembly of claim 1, wherein contact elements 28 of insulating body 23A, 23B are located inside each receiving recess 50 in m columns, each column extending in a direction parallel to said metal partitions 43, said columns being spaced apart by a distance p, wherein each contact elements 28 is located in each receiving recess, and is separated from those contact elements located in an adjacent recess by a distance equal to kp, where k is a whole number.

5. The shielding assembly of claim 4 wherein the values of m and k are equal to 2 and 3, respectively.

6. The shielding assembly of claim 4 wherein each shielded connector has a rectangular coupling face 31, and has, in a direction perpendicular to partitions 43, a dimension d that satisfies the double inequality:

$$(m+k-2)p < d < (m+k-1)p$$

wherein said partitions 43 each have a thickness whose value e is given by the relationship:

$$e = (m+k-1)p - d - j$$

wherein j represents an amount of play required for a shielded connector to slide inside a receiving recess.

7. The shielding assembly of claim 6 wherein each of said partitions 43 is characterized by a thickness of 1 mm.

8. The shielding assembly wherein each of said partitions 43 includes one part whose cross section is essentially in the shape of a U, said portions 51 of this part corresponding to the arms of said U having a length t that is less than a distance separating two consecutive partitions, said parts thus constituting polarizing means for the shielded connectors inserted into receiving recesses 50.

9. The shielding assembly of claim 1 wherein said walls 41, 42 and said partitions 43 consist essentially of stainless steel.

* * * * *

UNITED STATES PATENT AND TRADEMARK OFFICE
CERTIFICATE OF CORRECTION

PATENT NO. : 5,045,977
DATED : September 3, 1991
INVENTOR(S) : Charles Cesar

It is certified that error appears in the above-identified patent and that said Letters Patent is hereby corrected as shown below:

Column 4, line 34, "of circuit board 21 s that" should read --of circuit board 21 so that--

Column 7, lines 29/30 "metal partitions 43 is equal to;" should read --metal partitions 43 is equal to:--.

Column 8, line 56, "adjacent to said coupling face 29," should read --are adjacent to said coupling face 29,--.

Column 9, line 21, "through said outer edges 47, 49" should read --through said outer external edges 47, 49--.

Column 10, line 22, "8. The shielding assembly of claim wherein" should read --8. The shielding assembly of claim 1 wherein--.

Signed and Sealed this

Eighteenth Day of May, 1993

Attest:

MICHAEL K. KIRK

Attesting Officer

Acting Commissioner of Patents and Trademarks